US009093949B2

(12) United States Patent
Sadhu et al.

(10) Patent No.: US 9,093,949 B2
(45) Date of Patent: Jul. 28, 2015

(54) CURRENT RE-USE OSCILLATOR, DOUBLER AND REGULATOR CIRCUIT

(71) Applicant: INTERNATIONAL BUSINESS MACHINES CORPORATION, Armonk, NY (US)

(72) Inventors: Bodhisatwa Sadhu, White Plains, NY (US); Mihai A. Sanduleanu, Yorktown Heights, NY (US); Alberto Valdes Garcia, Hartsdale, NY (US); Scott K. Reynolds, Amawalk, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/031,530

(22) Filed: Sep. 19, 2013

(65) Prior Publication Data
US 2015/0077191 A1 Mar. 19, 2015

(51) Int. Cl.
H03B 5/08 (2006.01)
H03B 5/12 (2006.01)

(52) U.S. Cl.
CPC .............. *H03B 5/1206* (2013.01); *H03B 5/124* (2013.01); *H03B 5/1215* (2013.01); *H03B 5/1228* (2013.01)

(58) Field of Classification Search
USPC ............................................ 331/117 FE, 74
See application file for complete search history.

(56) References Cited

U.S. PATENT DOCUMENTS

| 4,628,284 | A | 12/1986 | Bruning et al. |
| 4,918,406 | A | 4/1990 | Baumbach et al. |
| 6,429,748 | B2 | 8/2002 | Nicholls et al. |
| 6,456,167 | B1 | 9/2002 | Huang |
| 6,911,870 | B2 * | 6/2005 | Gierkink et al. ................ 331/46 |
| 7,446,617 | B2 | 11/2008 | Jang et al. |
| 7,659,788 | B2 | 2/2010 | Koerner |
| 7,671,689 | B2 | 3/2010 | Deng et al. |
| 7,961,058 | B2 | 6/2011 | Luong et al. |
| 8,031,019 | B2 | 10/2011 | Chawla et al. |
| 8,830,000 | B2 * | 9/2014 | Jeong et al. .................... 330/311 |
| 2008/0266007 | A1 | 10/2008 | Tsai |
| 2011/0156829 | A1 * | 6/2011 | Wang ...................... 331/117 FE |
| 2013/0009279 | A1 * | 1/2013 | Ding et al. ..................... 257/531 |
| 2013/0063218 | A1 | 3/2013 | Sadhu et al. |

OTHER PUBLICATIONS

Cao et al., "GHz push-push VCO in 0.13um CMOS" Electronics Letters, vol. 42, No. 4, Feb. 2006. (3 pages).
Jang et al., "A low power push-push differential VCO using current-reuse circuit design technique" Progress in Electromagnetics Research C, vol. 27, Feb. 2012, pp. 85-97.
Molavi et al., "A 27-GHz Low-Power Push-Push LC VCO with Wide Tuning Range in 65nm CMOS" Circuits and Systems (ISCAS), May 2011, pp. 1141-1144.

* cited by examiner

*Primary Examiner* — Joseph Chang
(74) *Attorney, Agent, or Firm* — Tutunjian & Bitetto, P.C.; Anne V. Dougherty

(57) ABSTRACT

There is provided an integrated electronic circuit. The integrated electronic circuit includes a voltage controlled oscillator and a frequency doubler connected to the voltage controlled oscillator. A frequency doubling input of the frequency doubler is load isolated from an output of the voltage controlled oscillator.

12 Claims, 15 Drawing Sheets

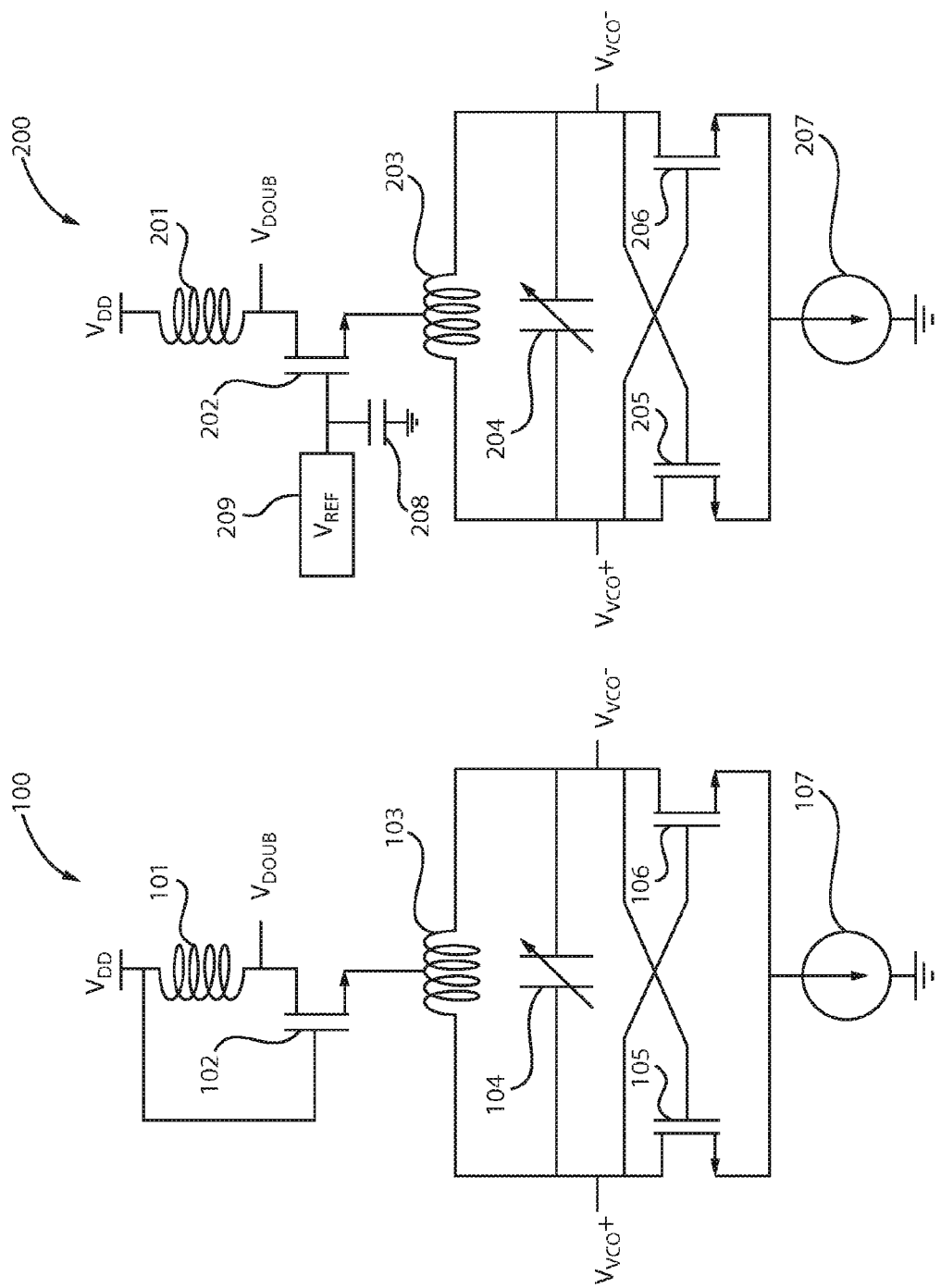

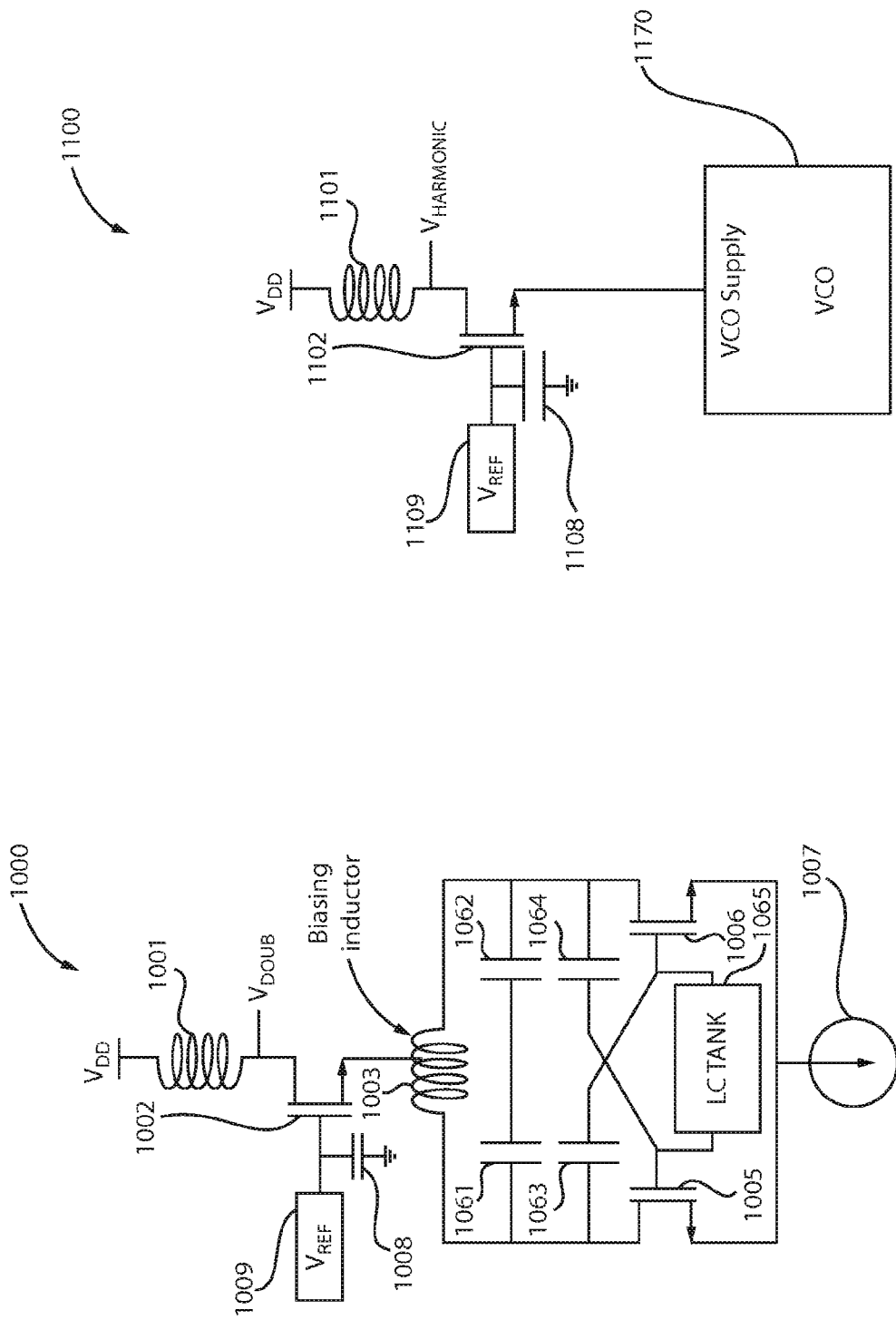

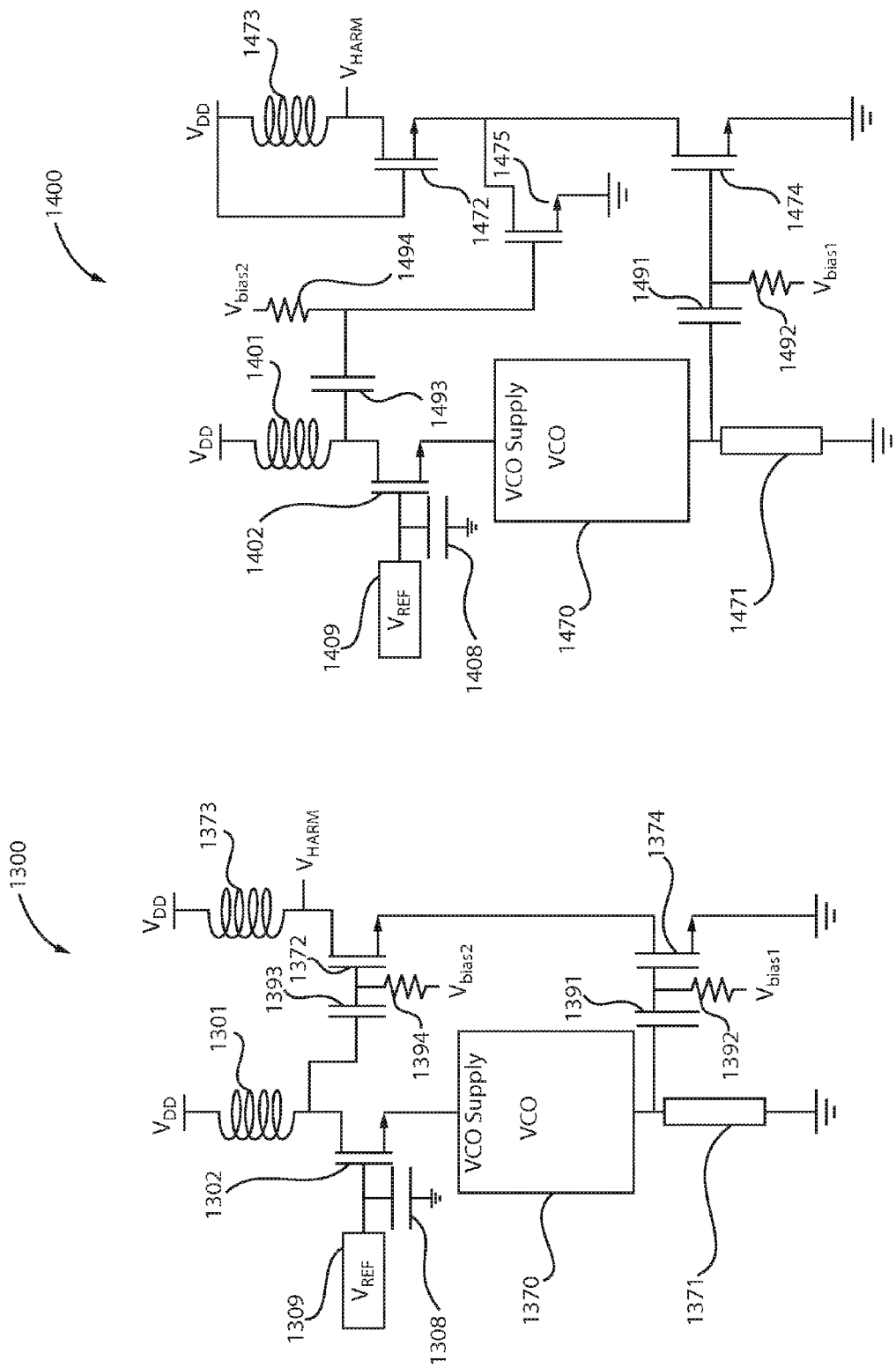

CURRENT RE-USE OSCILLATOR, DOUBLER AND REGULATOR CIRCUIT

BACKGROUND

1. Technical Field

The present invention relates generally to circuits and, in particular, to a current re-use oscillator, frequency doubler, and regulator circuit.

2. Description of the Related Art

Known solutions for frequency doublers include push-push architectures which consume additional power and loads the voltage controlled oscillator (VCO) output. Moreover, a separate regulator circuit is required for improving the oscillator phase noise performance.

SUMMARY

According to an aspect of the present principles, there is provided an integrated electronic circuit. The integrated electronic circuit includes a voltage controlled oscillator and a frequency doubler connected to the voltage controlled oscillator. A frequency doubling input of the frequency doubler is load isolated from an output of the voltage controlled oscillator.

According to another aspect of the present principles, there is provided an integrated electronic circuit. The integrated electronic circuit includes a voltage controlled oscillator and a harmonic frequency generator connected to the voltage controlled oscillator. A harmonic frequency input of the harmonic frequency generator is load isolated from an output of the voltage controlled oscillator.

According to yet another aspect of the present principles, there is provided a method. The method includes forming a voltage controlled oscillator and a frequency doubler as an integrated electronic circuit having a frequency doubling input of the frequency doubler load isolated from an output of the voltage controlled oscillator. The method also includes generating a waveform of a particular frequency using the voltage controlled oscillator. The method further includes doubling and outputting the waveform with a frequency double the particular frequency using the frequency doubler.

According to still another aspect of the present principles, there is provided a method. The method includes forming a voltage controlled oscillator and a harmonic frequency generator as an integrated electronic circuit having a harmonic frequency input of the harmonic frequency generator load isolated from an output of the voltage controlled oscillator. The method also includes generating a waveform of a particular frequency using the voltage controlled oscillator. The method further includes generating and outputting the waveform with harmonic frequencies of the particular frequency using the harmonic frequency generator.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 1 is a schematic diagram showing a frequency doubler 100, in accordance with an embodiment of the present principles;

FIG. 2 is a schematic diagram showing a frequency doubler and regulator and voltage controlled oscillator (VCO) 200, in accordance with an embodiment of the present principles;

FIG. 10 is a schematic diagram showing a frequency doubler 1000 having a decoupled voltage controlled oscillator (VCO), in accordance with an embodiment of the present principles;

FIG. 11 is a schematic diagram showing an oscillator and harmonic generator device 1100, in accordance with an embodiment of the present principles;

FIG. 13 is a schematic diagram showing an oscillator and harmonic combining device 1300, in accordance with an embodiment of the present principles;

FIG. 14 is a schematic diagram showing another oscillator and harmonic combining device 1400, in accordance with an embodiment of the present principles;

DETAILED DESCRIPTION OF PREFERRED EMBODIMENTS

Figure 3:
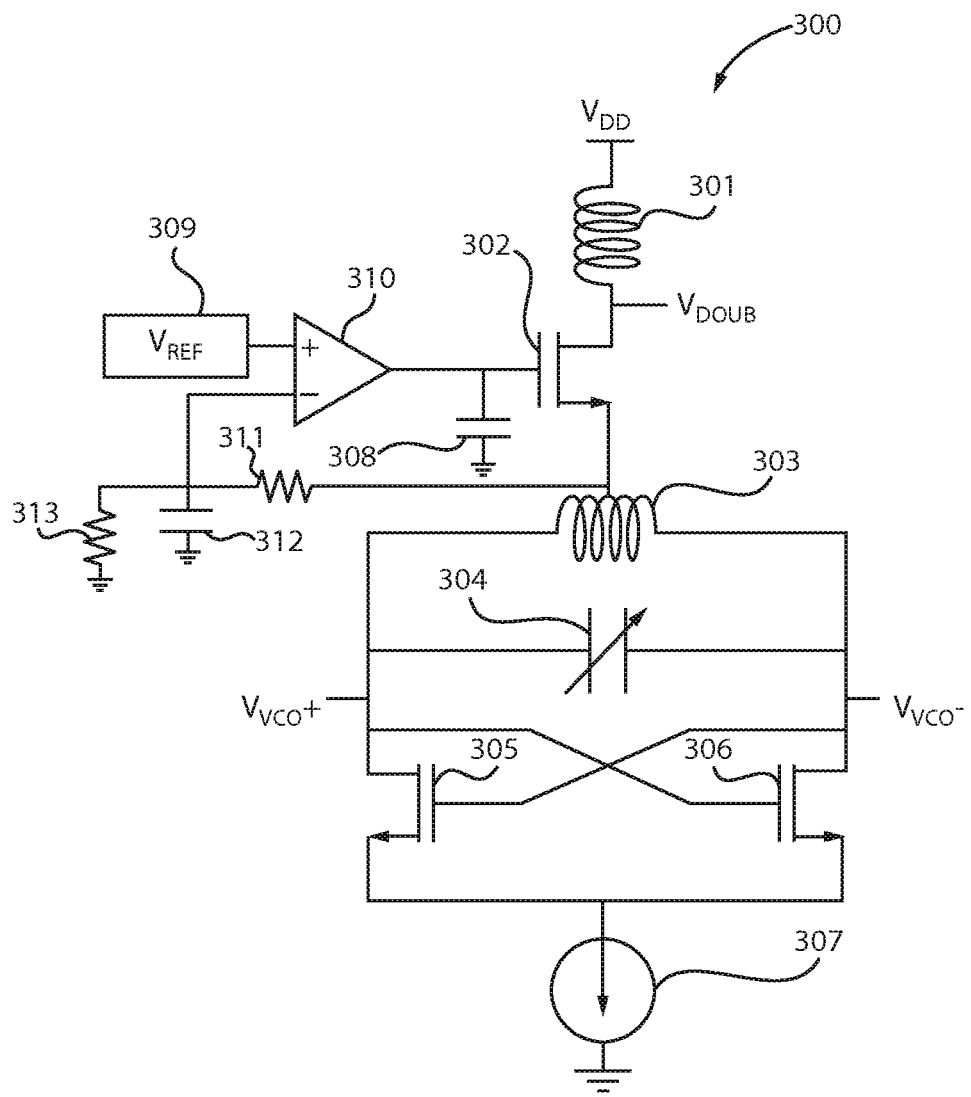
FIG. 3 is a schematic diagram showing another frequency doubler and regulator and voltage controlled oscillator (VCO) 300, in accordance with an embodiment of the present principles.

The present principles are directed to a current re-use oscillator, frequency doubler, and regulator circuit. In an embodiment, an oscillator, frequency doubler, and regulator circuit is provided that performs the functions of an oscillator, frequency doubler and regulator at the same time. In an embodiment, this circuit performs all the functions (oscillator, frequency doubler, regulator) by using the same current, thus reducing power consumption. Moreover the frequency doubler advantageously does not load the output of the VCO. These and other advantages of the present principles are described in further detail herein.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Moreover, it is to be appreciated that while each of FIGS. 1-16 include n-channel MOSFETs, the present principles are not limited to the use of n-channel MOSFETs and, thus, other types of transistors (e.g., bipolar junction transistors (BJTs), etc.) as well as p-channel MOSFETs can also be used in accordance with the teachings of the present principles, while maintaining the spirit of the present principles. It is to be further appreciated that FIGS. 1-4, 6, and 8-16 shows various integrated electronic circuits having different circuit types included therein. In one or more embodiments of FIGS. 1-4, 6, and 8-16, one or more elements of one particular circuit type may be common (shared) with another particular circuit type. For example, one or more elements (e.g., an inductor, a capacitor, a resistor, an active device, etc.) from a frequency doubler circuit may be shared with a voltage controlled oscillator (VCO). In this way, complexity, size, and so forth are advantageously reduced, while providing the expected functionality. The preceding example involving the frequency doubler and VCO are provided for illustrative purposes and, thus, such shared elements approach may be used for any of the circuits shown in FIGS. 1-4, 6, and 8-16. These and other variations of the present principles are readily contemplated by one of ordinary skill in the art, given the teachings of the present principles provided herein, while maintaining the spirit of the present principles.

FIG. 1 shows a frequency doubler 100, in accordance with an embodiment of the present principles. The frequency doubler 100 includes an inductor 101, a field-effect transistor (FET) 102, a variable inductor 103, a variable capacitor 104, a FET 105, a FET 106, and a current source 107.

A description of the connections of the elements of the frequency doubler 100 of FIG. 1 will now be given. A first side of the inductor 101 is connected to a voltage $V_{DD}$ and a gate of a FET 102 and a second side of the inductor 101 is connected to a drain of the FET 102 and a voltage tap $V_{DOUB}$. A source of the FET 102 is connected to a control input of the variable inductor 103. A first side of the variable inductor 103 is connected to a first side of the variable capacitor 104, a voltage tap $V_{VCO+}$, a drain of the FET 105, and a gate of the FET 106. A second side of the variable inductor 103 is connected to a second side of the variable capacitor 104, a voltage tap $V_{VCO-}$, a drain of the FET 106, and a gate of the FET 105. A source of the FET 105 is connected to a source of the FET 106 and a first side of the current source 107. A second side of the current source 107 is connected to ground.

A description will now be given of some of the many advantages of the frequency doubler 100 of FIG. 1, in accordance with an embodiment of the present principles. Several advantages are improved the VCO tuning range and increased the oscillation frequency due to the new topology of the frequency doubler 100 not loading the VCO outputs. That is, the input of the frequency doubler 100 is load isolated from the VCO outputs such that the VCO outputs do not have to drive the frequency doubler. The frequency doubler extracts the second harmonic frequency from the VCO and provides an amplified and buffered output without adding any extra load to the VCO. As a result, the VCO does not suffer any loss in tuning range or oscillation frequency. Another advantage is that the stacking configuration of the frequency doubler 100 removes excess doubler power. Yet another advantage is that the common gate amplifier increases the doubler output power. Still another advantage is that the doubler transistor gate at AC ground improves the amplifier efficiency. Moreover, another advantage is that the impedance at the VCO inductor center tap, optimized for double frequency, also improves the VCO spectral purity.

FIG. 2 shows a frequency doubler and regulator and voltage controlled oscillator (VCO) 200, in accordance with an embodiment of the present principles. The frequency doubler and regulator and VCO 200 includes an inductor 201, a field-effect transistor (FET) 202, a variable inductor 203, a variable capacitor 204, a FET 205, a FET 206, a current source 207, a capacitor 208, and a voltage reference source $V_{REF}$ 209.

A description of the connections of the elements of the frequency doubler and regulator and VCO 200 of FIG. 2 will now be given. A first side of the inductor 201 is connected to a voltage $V_{DD}$ and a second side of the inductor 201 is connected to a drain of the FET 202 and a voltage tap $V_{DOUB}$. A gate of a FET 202 is connected to a first side of the capacitor 208 and an output of the voltage reference source $V_{REF}$ 209. A source of the FET 202 is connected to a control input of the variable inductor 203. A first side of the variable inductor 203 is connected to a first side of the variable capacitor 204, a voltage tap $V_{VCO+}$, a drain of the FET 205, and a gate of the FET 206. A second side of the variable inductor 203 is connected to a second side of the variable capacitor 204, a voltage tap $V_{VCO-}$, a drain of the FET 206, and a gate of the FET 205. A source of the FET 205 is connected to a source of the FET 206 and a first side of the current source 207. A second side of the current source 207 is connected to ground.

A description will now be given of some of the many advantages of the frequency doubler and regulator and VCO 200 of FIG. 2, in accordance with an embodiment of the present principles. One advantage is that it retains the advantages of the frequency doubler 100 of FIG. 1. Another advantage is that the sensitive VCO supply voltage is regulated using a reference voltage. Yet another advantage is that the reference voltage can be generated in various ways.

FIG. 3 shows another frequency doubler and regulator and voltage controlled oscillator (VCO) 300, in accordance with an embodiment of the present principles. The frequency doubler and regulator and VCO 300 includes an inductor 301, a field-effect transistor (FET) 302, a variable inductor 303, a variable capacitor 304, a FET 305, a FET 306, a current source 307, a capacitor 308, a voltage reference source $V_{REF}$ 309, an operational amplifier (OPAMP) 310, a resistor 311, a capacitor 312, and a resistor 313.

A description of the connections of the elements of the frequency doubler and regulator and VCO 300 of FIG. 3 will now be given. A first side of the inductor 301 is connected to a voltage $V_{DD}$ and a second side of the inductor 301 is connected to a drain of the FET 302 and a voltage tap $V_{DOUB}$. A gate of a FET 302 is connected to a first side of the capacitor 308 and an output of the OPAMP 310. A non-inverting input of the OPAMP 310 is connected to an output of a voltage reference source $V_{REF}$ 309. An inverting input of the OPAMP 310 is connected to a first side of the resistor 311, a first side of the capacitor 312, and a first side of the resistor 313. A second side of the capacitor 312 is connected to ground. A second side of the resistor 313 is connected to ground. A source of the FET 302 is connected to a control input of the variable inductor 303 and a second side of the resistor 311. A first side of the variable inductor 303 is connected to a first side of the variable capacitor 304, a voltage tap $V_{VCO+}$, a drain of the FET 305, and a gate of the FET 306. A second side of the variable inductor 303 is connected to a second side of the variable capacitor 304, a voltage tap $V_{VCO-}$, a drain of the FET 306, and a gate of the FET 305. A source of the FET 305 is connected to a source of the FET 306 and a first side of the current source 307. A second side of the current source 307 is connected to ground.

A description will now be given of some of the many advantages of the frequency doubler and regulator and VCO 300 of FIG. 3, in accordance with an embodiment of the present principles. One advantage is that it retains advantages of the frequency doubler 100 of FIG. 1 and the frequency doubler and regulator and VCO 200 of FIG. 2. Another advantage is that the supply voltage can be regulated to a given reference voltage that is reliably generated. Yet another advantage is that an operational amplifier (OpAmp) based feedback loop is utilized for supply regulation.

Figure 4:
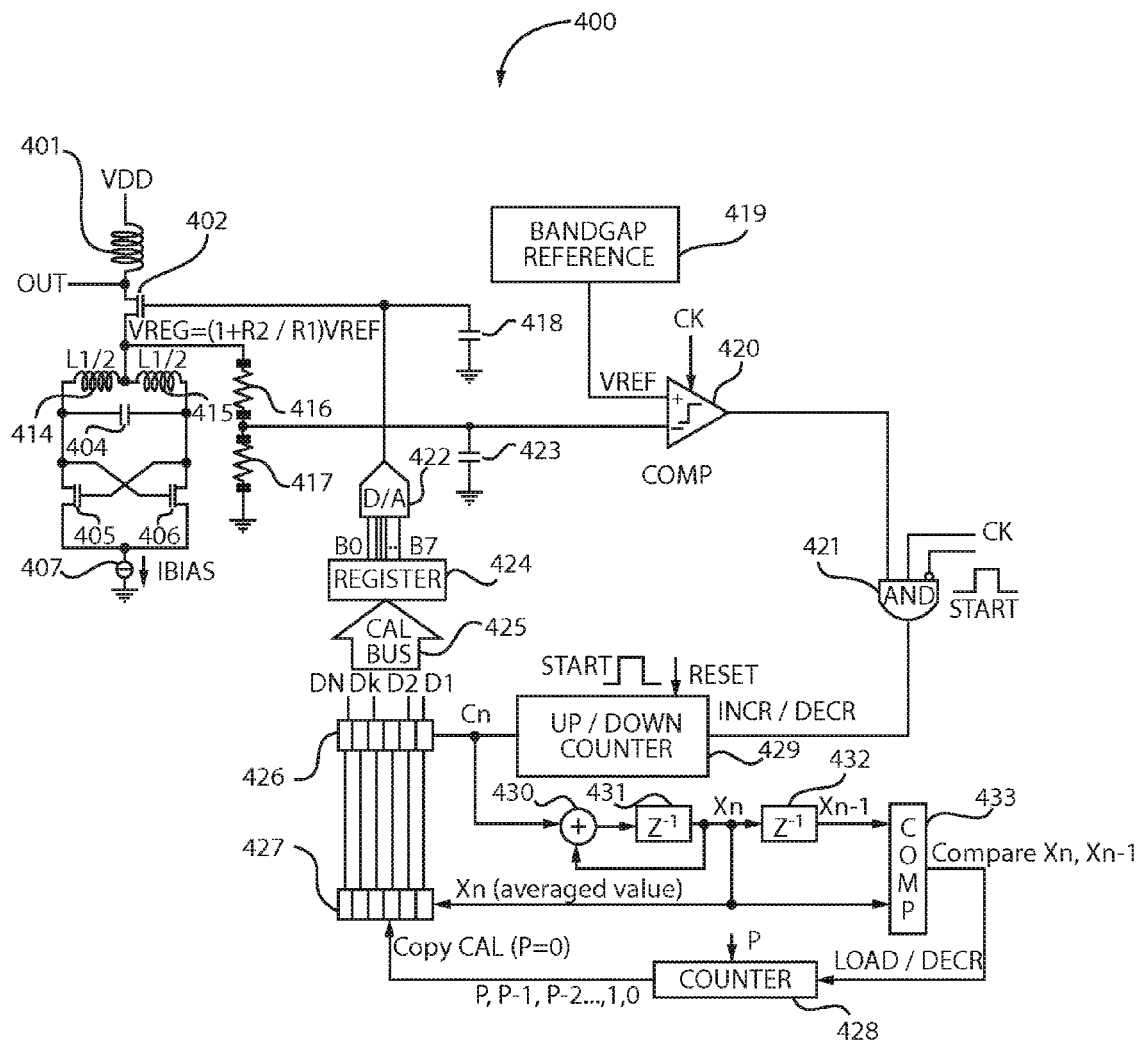
FIG. 4 is a schematic diagram showing yet another frequency doubler and regulator and voltage controlled oscillator (VCO) 400, in accordance with an embodiment of the present principles.

FIG. 4 shows yet another frequency doubler and regulator and voltage controlled oscillator (VCO) 400, in accordance with an embodiment of the present principles. The frequency doubler and regulator and VCO 400 includes an inductor 401, a field-effect transistor (FET) 402, a capacitor 404, a FET 405, a FET 406, a current source 407, an inductor 414, an inductor 415, a resistor 416, a resistor 417, a capacitor 418, a bandgap reference source 419, a comparator 420, an AND gate 421, a digital-to-analog converter (D/A) 422, a capacitor 423, a register 424, a calibration (cal) bus 425, a counter register 426, a calibration (cal) register 427, a counter 428, an up/down counter 429, a combiner 430, a delay element 431, a delay element 432, and a comparator (comp) 433.

A description of the connections of the elements of the frequency doubler and regulator and VCO 400 of FIG. 4 will now be given. A first side of the inductor 401 is connected to a voltage $V_{DD}$ and a second side of the inductor 401 is connected to a drain of the FET 402 and a voltage tap OUT. A gate of a FET 402 is connected to a first side of the capacitor 418 and an output of the D/A converter 422. A second side of the capacitor 418 is connected to ground. A source of the FET 402 is connected to a first side of the inductor 414, a first side of the inductor 415, and a first side of the resistor 416. A second side of the resistor 416 is connected to a first side of the resistor 417, a first side of the capacitor 423, and an inverting input of the comparator 420. The second side of the capacitor 423 is connected to ground. A second side of the inductor 414 is connected to a first side of the variable capacitor 404, a drain of the FET 405, and a gate of the FET 406. A second side of the inductor 415 is connected to a second side of the variable capacitor 404, a drain of the FET 406, and a gate of the FET 405. A source of the FET 405 is connected to a source of the FET 406 and a first side of the current source 407. A second side of the current source 407 is connected to ground. A non-inverting input of the comparator 420 is connected to a bandgap reference source 419 that provide a voltage $V_{REF}$ thereto. An output of the comparator 420 is connected to a non-inverting first input of the AND gate 421. A non-inverting second input and an inverting third input of the AND gate 421 are connected to a clock CK. An output of the AND gate 421 is connected to an increment/decrement (INCR/DECR) input of the up/down counter 429. An output of the up/down counter 429 is connected to an input of the counter register 426 and a non-inverting first input of the combiner 430. An output of the combiner 430 is connected to an input of the delay element 431. An output of the delay element 431 is connected to an input of the delay element 432, a first input of the comparator 433, an input of the calibration register 427, and a non-inverting second input of the combiner 430. An output of the delay element 432 is connected to a second input of the comparator 433. An output of the comparator 433 is connected to an input of the counter 428. A control input of the counter 428 receives a signal P. An output of the counter 428 is connected to another input of the calibration register 427. Respective outputs of the calibration register 427 are connected to respective inputs of the counter register 426. Respective outputs of the counter register 426 are connected to respective inputs of the calibration bus 425. An output of the calibration bus 425 is connected to an input of the register 424. Respective outputs of the register 424 are connected to respective inputs of the D/A converter 422.

We want a stable supply for the VCO (VREG). However, it is difficult to build a classic regulator in modern deep submicron due to a lack of high gain amplifiers. However, we can make a comparator and use a Finite State Machine (FSM).

In the frequency doubler and regulator and VCO 400, a fraction of VREG is compared with VREF and a state machine controls the gate of the doubler transistor. The state machine is based on the up/down counter 429 with an averaging loop.

When P=0, copy the calibration register 427 into the counter register 426. The contents represent the averaged value (P cycles). When Xn>Xn−1 and Xn<Xn−1, then load P into the counter 428. When Xn=Xn−1, decrement the counter 428.

Figure 5:
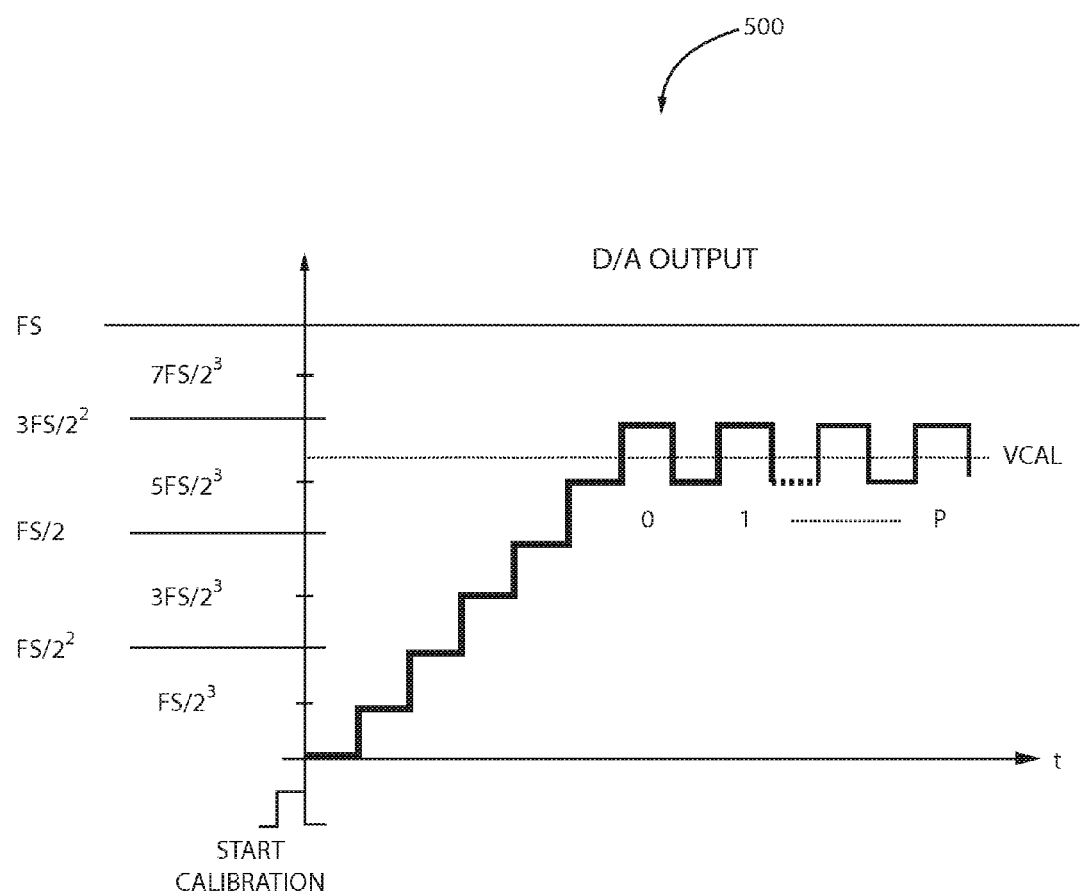
FIG. 5 is a schematic diagram showing the D/A output 500 of the frequency doubler and regulator and voltage controlled oscillator (VCO) 400 of FIG. 4, in accordance with an embodiment of the present principles.

FIG. 5 shows the D/A output 500 of the frequency doubler and regulator and voltage controlled oscillator (VCO) 400 of FIG. 4, in accordance with an embodiment of the present principles. In FIG. 5, the x-axis represents time and the y-axis represents the D/A output. At START, the counter increments until the D/A output trespasses the desired calibration value VCAL. After that, the averaging loop averages P clock cycles. The resulting value is accurate within the precision of the D/A system.

Referring back to FIG. 4, the output of the counter 429 is integrated and the result is Xn. After comparing Xn with its previous value, the counter 428 counts P cycles when Xn=Xn−1. The output of the D/A 422 is filtered on-chip.

Figure 6:
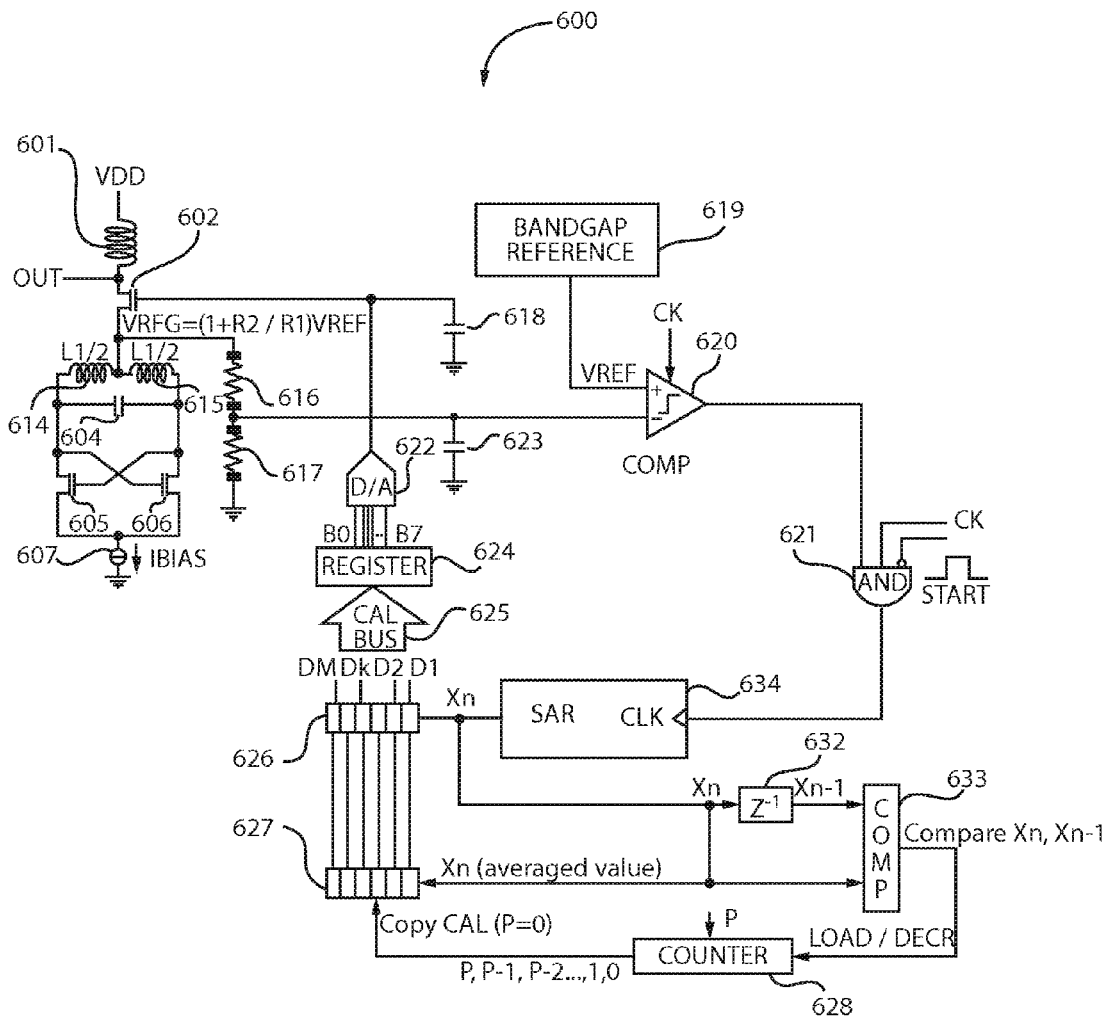
FIG. 6 is a schematic diagram showing still another frequency doubler and regulator and voltage controlled oscillator (VCO) 600, in accordance with an embodiment of the present principles.

FIG. 6 shows still another frequency doubler and regulator and voltage controlled oscillator (VCO) 600, in accordance with an embodiment of the present principles. The frequency doubler and regulator and VCO 600 includes an inductor 601, a field-effect transistor (FET) 602, a capacitor 604, a FET 605, a FET 606, a current source 607, an inductor 614, an inductor 615, a resistor 616, a resistor 617, a capacitor 618, a bandgap reference source 619, a comparator 620, an AND gate 621, a digital-to-analog converter (D/A) 622, a capacitor 623, a register 624, a calibration (cal) bus 625, a counter register 626, a calibration (cal) register 627, a counter 628, a delay element 632, a comparator (comp) 633, and an M bit successive approximation register (SAR) 634.

A description of the connections of the elements of the frequency doubler and regulator and VCO 600 of FIG. 6 will now be given. A first side of the inductor 601 is connected to a voltage $V_{DD}$ and a second side of the inductor 601 is connected to a drain of the FET 602 and a voltage tap OUT. A gate of a FET 602 is connected to a first side of the capacitor 618 and an output of the D/A converter 622. A second side of the capacitor 618 is connected to ground. A source of the FET 602 is connected to a first side of the inductor 614, a first side of the inductor 615, and a first side of the resistor 616. A second side of the resistor 616 is connected to a first side of the resistor 617, a first side of the capacitor 623, and an inverting input of the comparator 620. The second side of the capacitor 623 is connected to ground. A second side of the inductor 614 is connected to a first side of the variable capacitor 604, a drain of the FET 605, and a gate of the FET 606. A second side of the inductor 615 is connected to a second side of the variable capacitor 604, a drain of the FET 606, and a gate of the FET 605. A source of the FET 605 is connected to a source of the FET 606 and a first side of the current source 607. A second side of the current source 607 is connected to ground. A non-inverting input of the comparator 620 is connected to a bandgap reference source 619 that provide a voltage $V_{REF}$ thereto. An output of the comparator 620 is connected to a non-inverting first input of the AND gate 621. A non-inverting second input and an inverting third input of the AND gate 621 are connected to a clock CK. An output of the AND gate 621 is connected to a clock input of the M bit SAR 634. An output of the M bit SAR 634 is connected to an input of the counter register 626, an input of the delay element 632, a first input of the comparator 633, and an input of the calibration register 627. An output of the delay element 632 is connected to a second input of the comparator 633. An output of the comparator 633 is connected to an input of the counter 628. A control input of the counter 628 receives a signal P. An output of the counter 628 is connected to another input of the calibration register 627. Respective outputs of the calibration register 627 are connected to respective inputs of the counter register 626. Respective outputs of the counter register 626 are connected to respective inputs of the calibration bus 625. An output of the calibration bus 625 is connected to an input of the register 624. Respective outputs of the register 624 are connected to respective inputs of the D/A converter 622.

The doubler and regulator and VCO 600 includes a SAR based state machine. Another option is to use the SAR algorithm with averaging.

When P=0, copy the calibration register 627 into the counter register 626. The contents represent the averaged value (P cycles). When Xn>Xn−1 and Xn<Xn−1, then load P into the counter 628. When Xn=Xn−1, decrement the counter 628.

Figure 7:
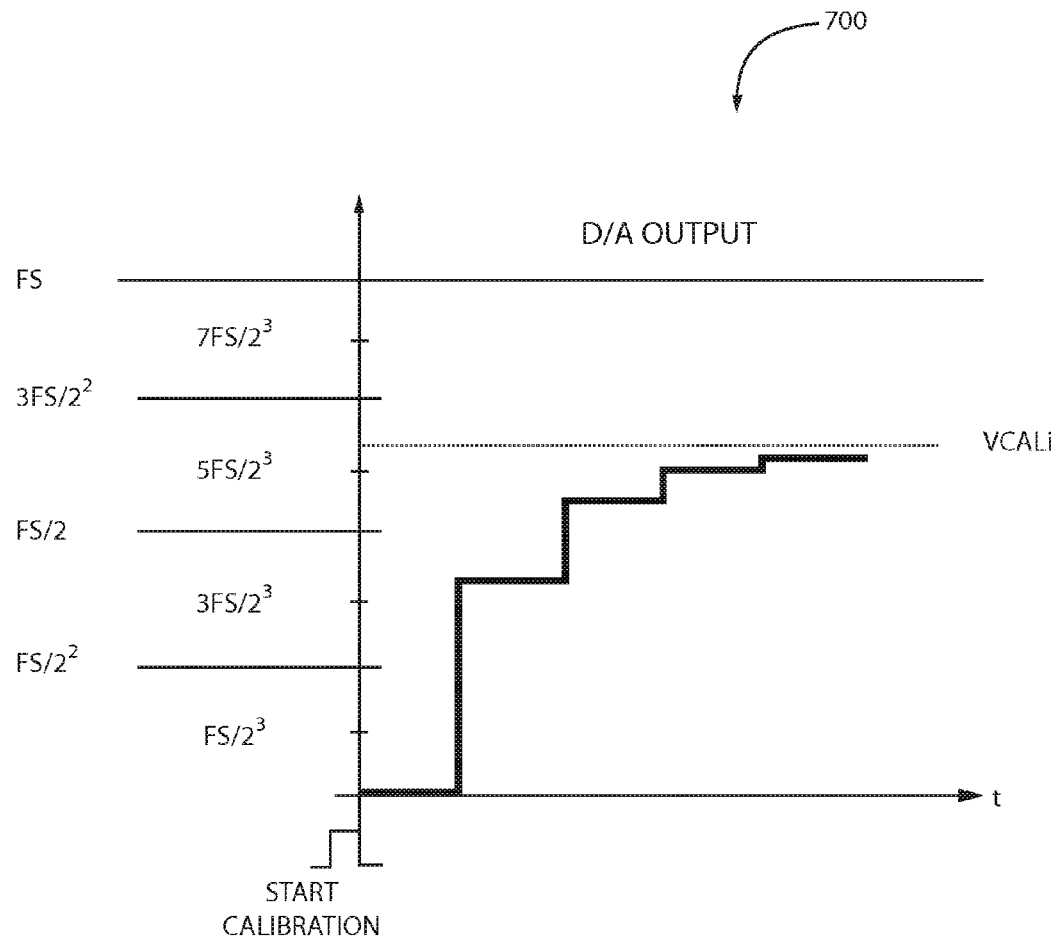
FIG. 7 is a schematic diagram showing the D/A output 700 of the frequency doubler and regulator and voltage controlled oscillator (VCO) 600 of FIG. 6, in accordance with an embodiment of the present principles.

A description will now be given of SAR for a 3-bit D/A converter with respect to the frequency doubler and regulator and voltage controlled oscillator (VCO) 600, in accordance with an embodiment of the present principles. FIG. 7 shows the D/A output 700 of the frequency doubler and regulator and voltage controlled oscillator (VCO) 600 of FIG. 6, in accordance with an embodiment of the present principles. In FIG. 7, the x-axis represents time and the y-axis represents the D/A output.

Figure 8:
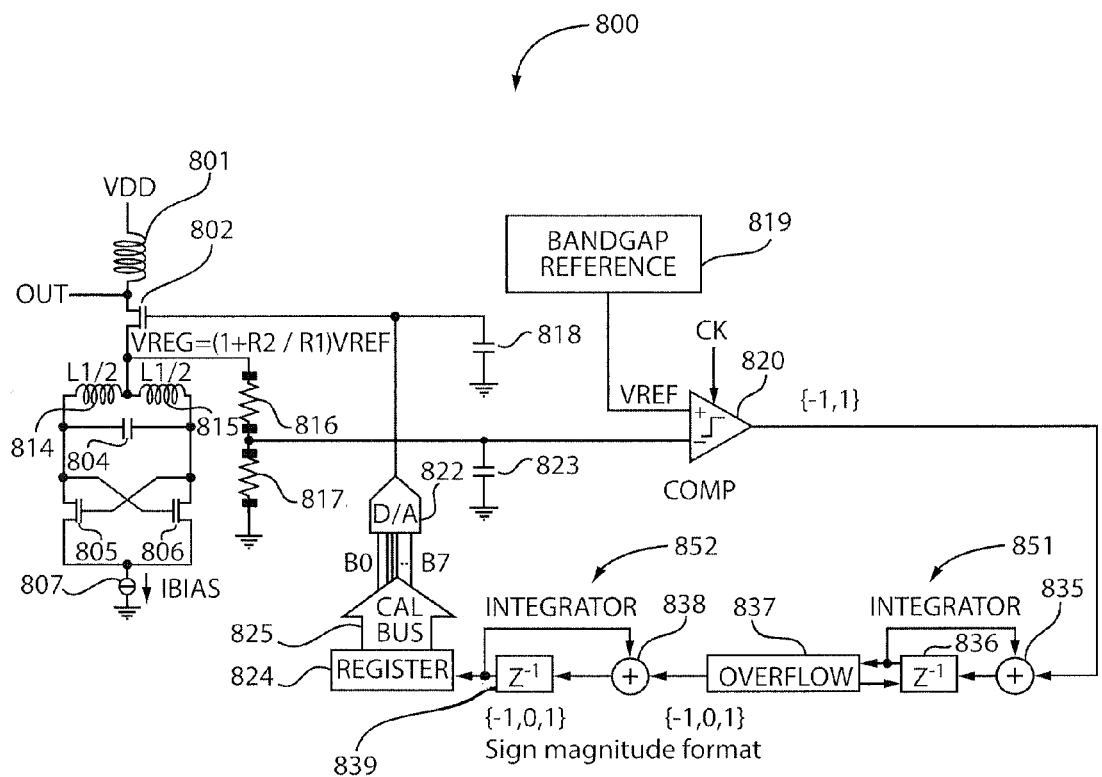
FIG. 8 is a schematic diagram showing an integrator-based frequency doubler and regulator and voltage controlled oscillator (VCO) 800, in accordance with an embodiment of the present principles.

FIG. 8 shows an integrator-based frequency doubler and regulator and voltage controlled oscillator (VCO) 800, in accordance with an embodiment of the present principles. The integrator-based frequency doubler and regulator and voltage controlled oscillator (VCO) 800 corresponds to the frequency doubler and regulator and VCO 600 of FIG. 6, but now including an integrator-based topology.

The frequency doubler and regulator and VCO 800 includes an inductor 801, a field-effect transistor (FET) 802, a capacitor 804, a FET 805, a FET 806, a current source 807, an inductor 814, an inductor 815, a resistor 816, a resistor 817, a capacitor 818, a bandgap reference source 819, a comparator 820, a digital-to-analog converter (D/A) 822, a capacitor 823, a register 824, a calibration (cal) bus 825, a combiner 835, a delay element 736, an overflow detector 837, a combiner 838, and a delay element 739.

A description of the connections of the elements of the frequency doubler and regulator and voltage controlled oscillator 800 of FIG. 8 will now be given. A first side of the inductor 801 is connected to a voltage $V_{DD}$ and a second side of the inductor 801 is connected to a drain of the FET 802 and a voltage tap OUT. A gate of a FET 802 is connected to a first side of the capacitor 818 and an output of the D/A converter 822. A second side of the capacitor 818 is connected to ground. A source of the FET 802 is connected to a first side of the inductor 814, a first side of the inductor 815, and a first side of the resistor 816. A second side of the resistor 816 is connected to a first side of the resistor 817, a first side of the capacitor 823, and an inverting input of the comparator 820. The second side of the capacitor 823 is connected to ground. A second side of the inductor 814 is connected to a first side of the variable capacitor 804, a drain of the FET 805, and a gate of the FET 806. A second side of the inductor 815 is connected to a second side of the variable capacitor 804, a drain of the FET 806, and a gate of the FET 805. A source of the FET 805 is connected to a source of the FET 806 and a first side of the current source 807. A second side of the current source 807 is connected to ground. A non-inverting input of the comparator 820 is connected to a bandgap reference source 819 that provide a voltage $V_{REF}$ thereto. An output of the comparator 820 is connected to a non-inverting first input of the combiner 835. An output of the combiner 835 is connected to a first input of the delay element 836. An output of the delay element 836 is connected to an input of an overflow detector 837 and a non-inverting second input of the combiner 835. A first output of the overflow detector 837 is connected to a second input of the delay element 836. A second output of the overflow detector 837 is connected to a non-inverting first input of the combiner 838. An output of the combiner 838 is connected to an input of the delay element 839. An output of the delay element 839 is connected to an input of the register 824 and a non-inverting second input of the combiner 838. Respective outputs of register 824 are connected to respective inputs of the calibration bus 825. Respective outputs of the calibration bus 825 are connected to respective inputs of the D/A converter 822.

As shown, a loop is formed by the topology of FIG. 8. The loop has two integrators with overflow/underflow detection. When the first integrator 851 reaches full scale, it passes CARRY to the next integrator 852 and RESETs the first integrator 851. The digital code presented to the D/A 822 is already averaged.

Figure 9:
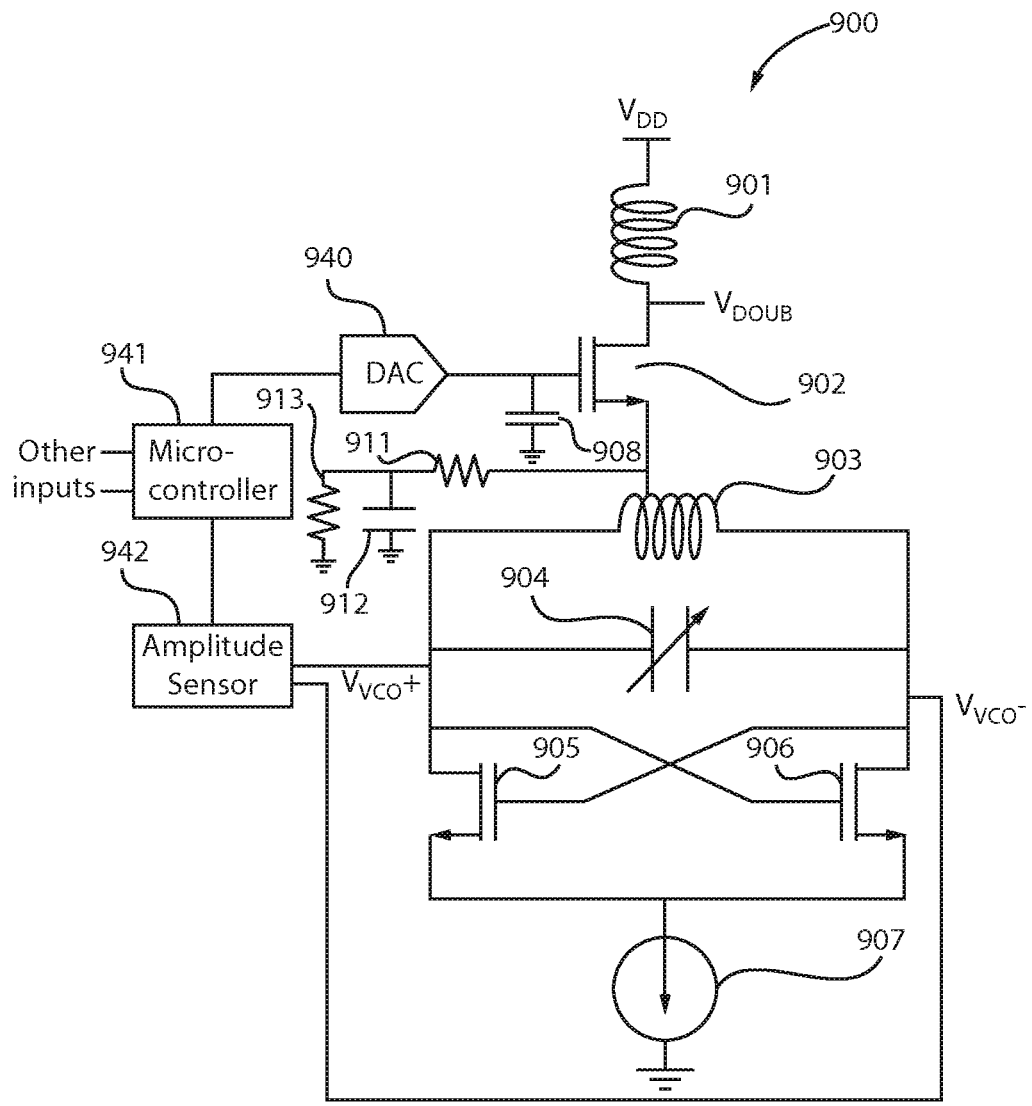
FIG. 9 is a schematic diagram showing still yet another frequency doubler and regulator and voltage controlled oscillator (VCO) 900, in accordance with an embodiment of the present principles.

FIG. 9 shows still yet another frequency doubler and regulator and voltage controlled oscillator (VCO) 900, in accordance with an embodiment of the present principles. The frequency doubler and regulator and VCO 900 includes an inductor 901, a field-effect transistor (FET) 902, a variable inductor 903, a variable capacitor 904, a FET 905, a FET 906, a current source 907, a capacitor 908, a voltage reference source $V_{REF}$ 909, a resistor 911, a capacitor 912, a resistor 913, a digital to analog converter (DAC) 940, a microcontroller 941, and an amplitude sensor 942.

A description of the connections of the elements of the frequency doubler and regulator and voltage controlled oscillator 900 of FIG. 9 will now be given. A first side of the inductor 901 is connected to a voltage $V_{DD}$ and a second side of the inductor 901 is connected to a drain of the FET 902 and a voltage tap $V_{DOUB}$. A gate of a FET 902 is connected to a first side of the capacitor 908 and an output of the DAC 940. An input of the DAC 940 is connected to an output of the microcontroller 841. A source of the FET 902 is connected to a control input of the variable inductor 903 and a first side of the resistor 911. A second side of the resistor 911 is connected to a first side of a capacitor 912 and a first side of a resistor 913. A second side of the capacitor 912 is connected to ground. A second side of the resistor 913 is connected to ground. A first input of the microcontroller 941 is connected to an output of the amplitude sensor 942. A first side of the variable inductor 903 is connected to a first side of the variable capacitor 904, a voltage tap $V_{VCO+}$, a drain of the FET 905, a gate of the FET 906, and a first input of the amplitude sensor 942. A second side of the variable inductor 903 is connected to a second side of the variable capacitor 304, a voltage tap $V_{VCO-}$, a drain of the FET 906, a gate of the FET 905, and a second input of the amplitude sensor 942. A source of the FET 905 is connected to a source of the FET 906 and a first side of the current source 907. A second side of the current source 907 is connected to ground.

A description will now be given of some of the many advantages of the frequency doubler and regulator and VCO 900 of FIG. 9, in accordance with an embodiment of the present principles. One advantage is that it retains advantages of the frequency doubler 100 of FIG. 1 and the frequency doubler and regulator and VCO 200 of FIG. 2. Another advantage is that the supply voltage can be regulated to a variable reference voltage. Yet another advantage is that the reference voltage is generated based on a microcontroller based feedback scheme. Still another advantage is that the supply voltage can be determined based on an algorithm that includes several factors including, but not limited to, VCO output amplitude, current supply voltage, and so forth.

A further description of several features of the invention will now be provided. The doubler load can be tuned to the desired frequency for increased amplitude. The doubler can be loaded with a balun to provide differential outputs at the double frequency. A quadrature voltage controlled oscillator (QVCO) can be used instead of a regular VCO to provide differential outputs with two doubler-regulators.

A description of several possible general extensions of the present principles will now be provided. Additional inductors/capacitors can be introduced to improve doubler output amplitude. A matching network may be constructed for efficient power delivery to the following stage(s). The VCO inductor ground plane can be isolated/resonated for larger center tap swing.

A description of several possible extensions regarding a decoupled VCO will now be provided. As used herein, "a decoupled VCO" refers to a VCO in which the tank is partially or fully dc-decoupled from the active devices. In other words, the tank is directly connected to either one or zero terminals of the active devices. FIG. 10 shows a frequency doubler 1000 having a decoupled voltage controlled oscillator (VCO), in accordance with an embodiment of the present principles. The frequency doubler 1000 includes an inductor 1001, a field-effect transistor (FET) 1002, a variable inductor 1003, a FET 1005, a FET 1006, a current source 1007, a capacitor 1008, a voltage reference source $V_{REF}$ 1009, a capacitor 1061, a capacitor 1062, a capacitor 1063, a capacitor 1064, and a LC tank 1065.

A description of the connections of the elements of the frequency doubler 1000 of FIG. 10 will now be given. A first side of the inductor 1001 is connected to a voltage $V_{DD}$ and a second side of the inductor 1001 is connected to a drain of the FET 1002 and a voltage tap $V_{DOUB}$. A gate of a FET 1002 is connected to a first side of the capacitor 1008 and an output of a voltage reference source $V_{REF}$ 1009. A second side of the capacitor 1008 is connected to ground. A source of the FET 1002 is connected to a control input of the variable inductor 1003 and a second side of the resistor 1011. A first side of the variable inductor 1003 is connected to a first side of the capacitor 1061, a first side of the capacitor 1063, and a drain of the FET 1005. A second side of the variable inductor 1003 is connected to a first side of the capacitor 1062, a first side of the capacitor 1064, and a drain of the FET 1006. A second side of the capacitor 1061 is connected to a second side of the capacitor 1062. A second side of the capacitor 1063 is connected to a gate of the FET 1006 and a first side of the LC tank 1065. A second side of the capacitor 1064 is connected to a gate of the FET 1005 and a second side of the LC tank 1065. A source of the FET 1005 is connected to a source of the FET 1006 and a first side of the current source 1007. A second side of the current source 1007 is connected to ground.

The frequency doubler 1000 completely decoupled from the tank as shown in FIG. 10 does not cause noise/loading issues. VCO transistor gate bias can be controlled independent of the doubler amp source voltage.

FIG. 11 shows an oscillator and harmonic generator device 1100, in accordance with an embodiment of the present principles. The oscillator and harmonic generator device 1100 includes an inductor 1101, a FET 1102, a capacitor 1108, a voltage reference source $V_{REF}$ 1109, and a VCO 1170.

A description of the connections of the elements of the oscillator and harmonic generator device 1100 of FIG. 11 will now be given. A first side of the inductor 1101 is connected to a voltage $V_{DD}$ and a second side of the inductor 1101 is connected to a drain of the FET 1102 and a voltage tap $V_{HARMONIC}$. A gate of a FET 1102 is connected to a first side of the capacitor 1108 and an output of a voltage reference source $V_{REF}$ 1109. A second side of the capacitor 1108 is connected to ground. A source of the FET 1102 is connected to the VCO 1170.

Figure 12:
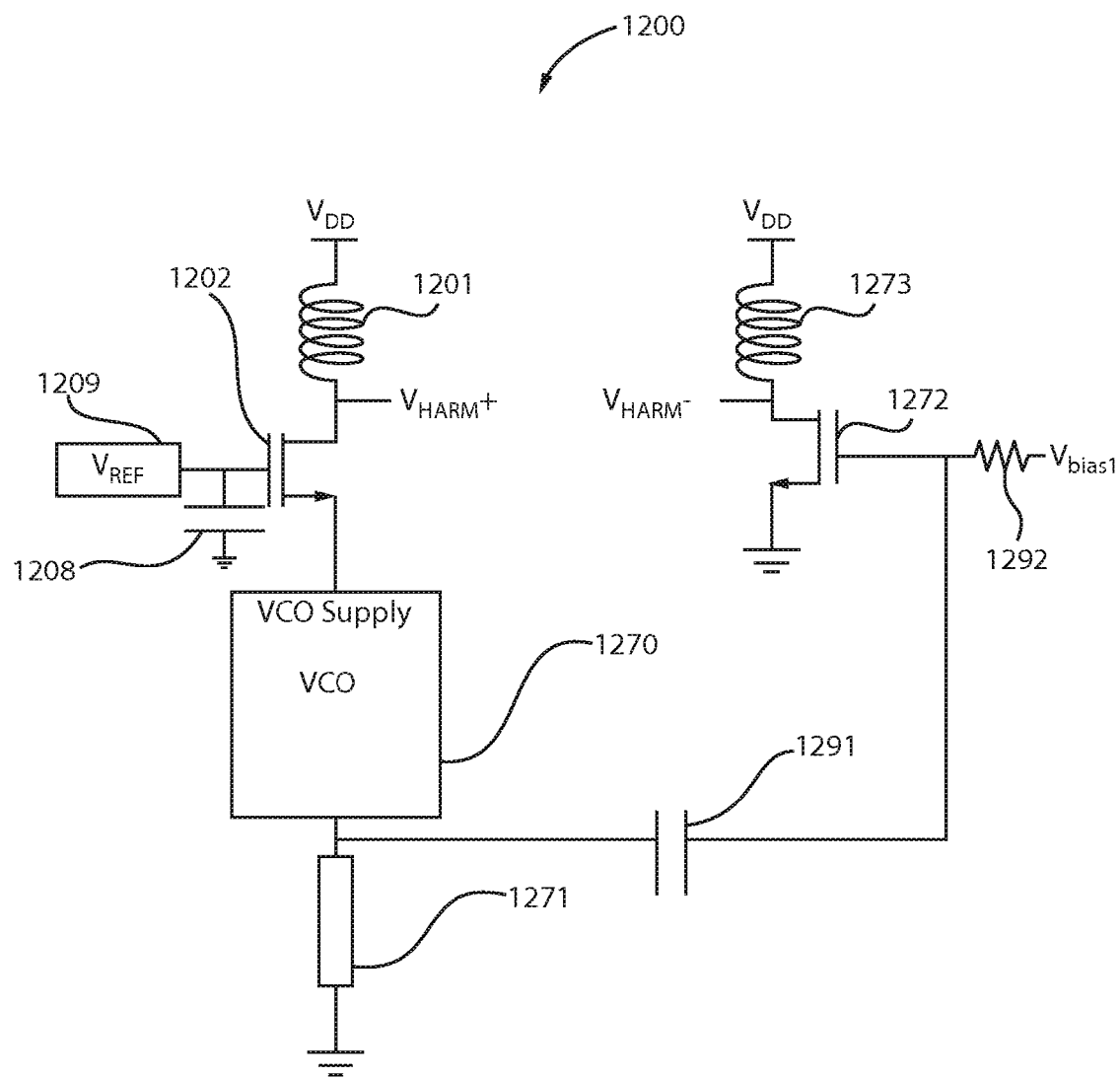
FIG. 12 is a schematic diagram showing another oscillator and harmonic generator device 1200, in accordance with an embodiment of the present principles.

FIG. 12 shows another oscillator and harmonic generator device 1200, in accordance with an embodiment of the present principles. The oscillator and harmonic generator device 1200 includes an inductor 1201, a FET 1202, a capacitor 1208, a voltage reference source $V_{REF}$ 1209, a VCO 1270, a transmission line (e.g., an inductor) 1271, a FET 1272, an inductor 1273, a capacitor 1291, and a resistor 1292.

A description of the connections of the elements of the oscillator and harmonic generator device 1200 of FIG. 12 will now be given. A first side of the inductor 1201 is connected to a voltage $V_{DD}$. A second side of the inductor 1201 is connected to a drain of the FET 1202 and a voltage tap $V_{HARM+}$. A gate of a FET 1202 is connected to a first side of the capacitor 1208 and an output of a voltage reference source $V_{REF}$ 1209. A second side of the capacitor 1208 is connected to ground. A source of the FET 1202 is connected to a first side (a VCO supply side) of the VCO 1270. A second side of the VCO 1270 is connected to a first side of the transmission line 1271 and a first side of the capacitor 1291. A second side of the capacitor 1291 is connected to a gate of the FET 1272 and a first side of the resistor 1292. A second side of the resistor 1292 is connected to a bias voltage $V_{bias1}$. A second side of the transmission line 1271 is connected to ground. A source of the FET 1272 is connected to ground. A first side of the inductor 1273 is connected to the voltage $V_{DD}$ and a second side of the inductor 1273 is connected to a drain of the FET 1272 and a voltage tap $V_{HARM-}$.

Regarding the oscillator and harmonic generator device 1200 of FIG. 12, we note that the tail node of the VCO 1270 also includes a harmonic frequency component. The harmonic frequency component can be amplified through a common source amplifier to obtain a differential harmonic frequency. It is to be noted that this scheme does not load the VCO 1270 and produces a differential harmonic frequency output (across $V_{Harm+}$ to $V_{Harm-}$) with no significant loss of VCO performance.

FIG. 13 shows an oscillator and harmonic combining device 1300, in accordance with an embodiment of the present principles. The oscillator and harmonic combining device 1300 includes an inductor 1301, a FET 1302, a capacitor 1308, a voltage reference source $V_{REF}$ 1309, a VCO 1370, a transmission line (e.g., an inductor) 1371, a FET 1372, an inductor 1373, a FET 1374, a capacitor 1291, a resistor 1292, a capacitor 1393, and a resistor 1394.

A description of the connections of the elements of the oscillator and harmonic combining device 1300 of FIG. 13 will now be given. A first side of the inductor 1301 is connected to a voltage $V_{DD}$. A second side of the inductor 1301 is connected to a drain of the FET 1302 and a first side of the capacitor 1393. A second side of the capacitor 1393 is connected to a first side of the resistor 1394 and a gate of the FET 1372. A second side of the resistor 1394 is connected to a bias voltage $V_{bias2}$. A gate of a FET 1302 is connected to a first side of the capacitor 1308 and an output of a voltage reference source $V_{REF}$ 1309. A second side of the capacitor 1308 is connected to ground. A source of the FET 1302 is connected to a first side (a VCO supply side) of the VCO 1370. A second side of the VCO 1370 is connected to a first side of the transmission line 1371 and a first side of the capacitor 1391. A second side of the capacitor 1391 is connected to a gate of the FET 1374 and a first side of the resistor 1392. A second side of the resistor 1392 is connected to a bias voltage $V_{bias1}$. A second side of the transmission line 1371 is connected to ground. A source of the FET 1374 is connected to ground. A drain of the FET 1374 is connected to a source of the FET 1372. A first side of the inductor 1373 is connected to the voltage $V_{DD}$ and a second side of the inductor 1373 is connected to a drain of the FET 1372 and a voltage tap $V_{HARM}$.

Regarding the oscillator and harmonic combining device 1300 of FIG. 13, we note that the tail node of the VCO also includes a harmonic frequency component with the same phase. The harmonic frequency component can be amplified through a common source amplifier and combined with the harmonic frequency on the supply as shown in FIGS. 13 and 14. It is to be noted that this scheme does not load the VCO and produces a differential harmonic frequency output with no loss of VCO performance.

FIG. 14 shows another oscillator and harmonic combining device 1400, in accordance with an embodiment of the present principles. The oscillator and harmonic combining device 1400 includes an inductor 1401, a FET 1402, a capacitor 1408, a voltage reference source $V_{REF}$ 1409, a VCO 1470, a transmission line (e.g., an inductor) 1471, a FET 1472, an inductor 1473, a FET 1474, a FET 1475, a capacitor 1491, a resistor 1492, a capacitor 1493, and a resistor 1494.

A description of the connections of the elements of the oscillator and harmonic combining device 1400 of FIG. 14 will now be given. A first side of the inductor 1401 is connected to a voltage $V_{DD}$. A second side of the inductor 1401 is connected to a drain of the FET 1402 and a first side of the capacitor 1493. A second side of the capacitor 1493 is connected in signal communication with a first side of the resistor 1494 and a gate of the FET 1475. A second side of the resistor 1494 is connected to a bias voltage $V_{bias2}$. A gate of a FET 1402 is connected to a first side of the capacitor 1408 and an output of a voltage reference source $V_{REF}$ 1409. A second side of the capacitor 1408 is connected to ground. A source of the FET 1402 is connected to a first side (a VCO supply side) of the VCO 1470. A second side of the VCO 1470 is connected to a first side of the transmission line 1471 and a first side of the capacitor 1491. A second side of the capacitor 1491 is connected to a first side of the resistor 1492 and a gate of the FET 1474. A second side of the resistor 1492 is connected to a bias voltage $V_{bias1}$. A second side of the transmission line 1471 is connected to ground. A source of the FET 1474 is connected to ground. A drain of the FET 1474 is connected to a source of the FET 1472, and a drain of the FET 1475. A first side of the inductor 1473 is connected to the voltage $V_{DD}$ and a gate of the FET 1472. A second side of the inductor 1473 is connected to a drain of the FET 1472 and a voltage tap $V_{HARM}$.

Figure 15:
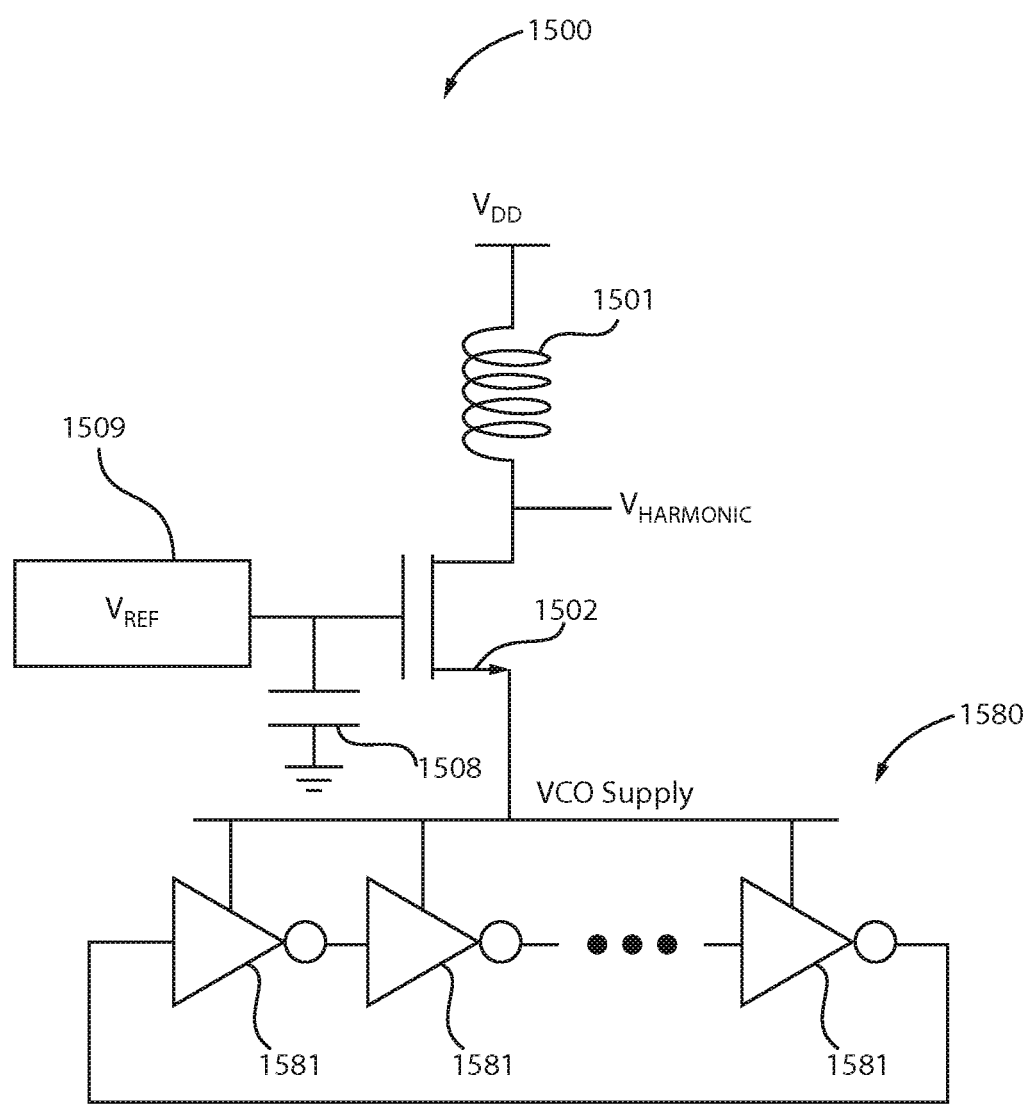
FIG. 15 is a schematic diagram showing a ring voltage controlled oscillator (VCO) and harmonic generator device 1500, in accordance with an embodiment of the present principles.

FIG. 15 shows a ring voltage controlled oscillator (VCO) and harmonic generator device 1500, in accordance with an embodiment of the present principles. The ring VCO and harmonic generator device 1500 includes an inductor 1501, a field-effect transistor (FET) 1502, a capacitor 1508, a voltage reference source $V_{REF}$ 1509, and a ring VCO 1580. The ring VCO 1580 includes a sequence of delay elements 1581. Other elements of the ring VCO 1580 are not shown for the sake of brevity.

A description of the connections of the elements of the ring VCO and harmonic generator device 1500 of FIG. 15 will now be given. A first side of the inductor 1501 is connected to a voltage $V_{DD}$ and a second side of the inductor 1501 is connected to a drain of the FET 1502 and a voltage tap $V_{HARMONIC}$. A gate of a FET 1502 is connected to a first side of the capacitor 1508 and an output of the voltage reference source $V_{REF}$ 1509. A second side of the capacitor 1508 is connected to ground. A source of the FET 1502 is connected to the ring VCO 1580.

Figure 16:
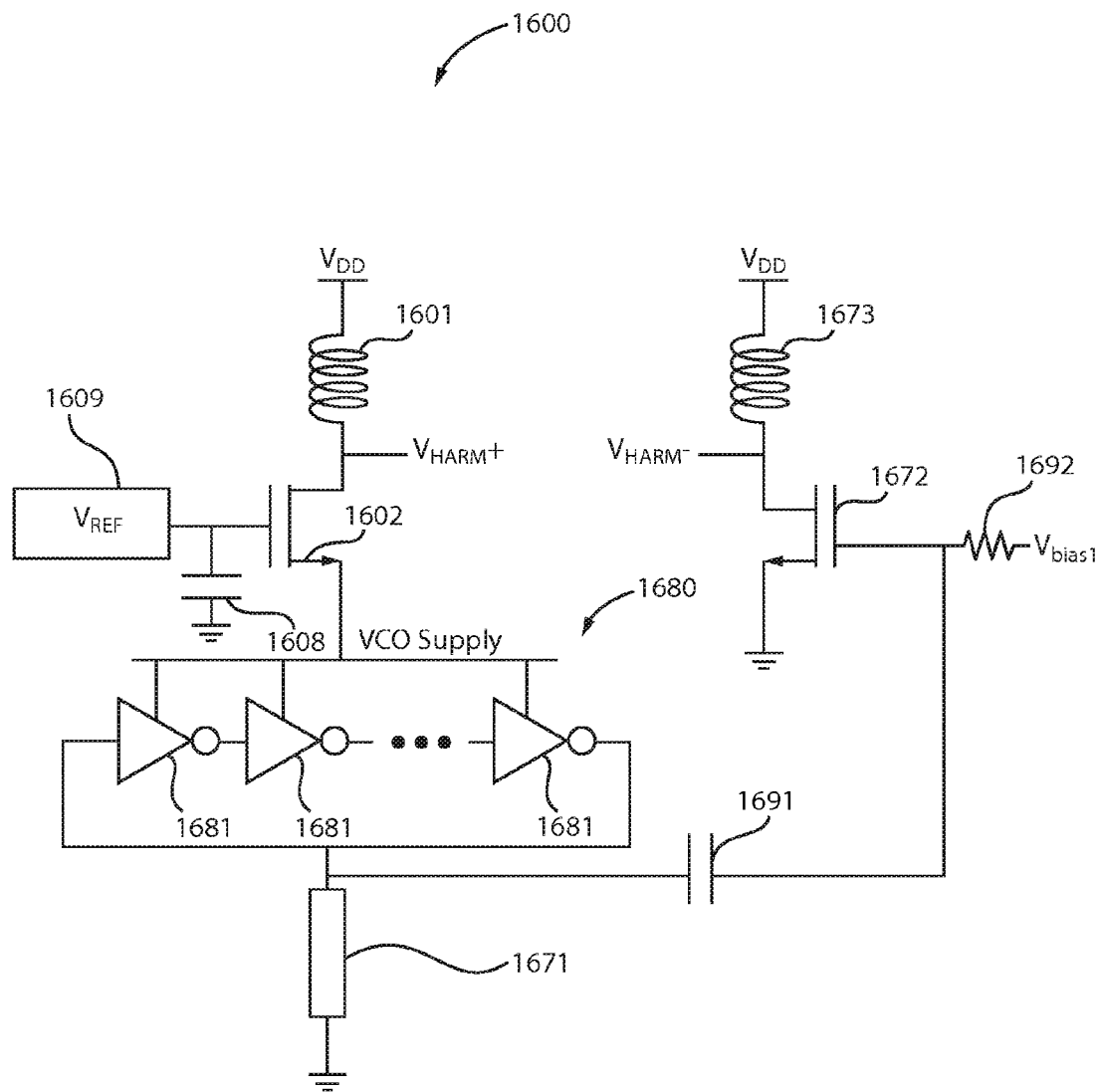
FIG. 16 is a schematic diagram showing another ring voltage controlled oscillator (VCO) and harmonic generator device 1600 having differential outputs, in accordance with an embodiment of the present principles.

FIG. 16 shows another ring voltage controlled oscillator (VCO) and harmonic generator device 1600 having differential outputs, in accordance with an embodiment of the present principles. The ring VCO and harmonic generator device 1600 includes an inductor 1601, a field-effect transistor (FET) 1502, a capacitor 1608, a voltage reference source $V_{REF}$ 1609, a transmission line (e.g., an inductor) 1671, a FET 1672, an inductor 1673, a ring VCO 1680, a capacitor 1691, and a resistor 1692. The ring VCO 1680 includes a sequence of delay elements 1681. Other elements of the ring VCO 1680 are not shown for the sake of brevity.

A description of the connections of the elements of the ring VCO and harmonic generator device 1600 of FIG. 16 will now be given. A first side of the inductor 1601 is connected to a voltage $V_{DD}$ and a second side of the inductor 1601 is connected to a drain of the FET 1602 and a voltage tap $V_{HARM+}$. A gate of a FET 1602 is connected to a first side of the capacitor 1608 and an output of the voltage reference source $V_{REF}$ 1609. A second side of the capacitor 1608 is connected to ground. A source of the FET 1602 is connected to a first side (a VCO supply side) of the ring VCO 1680. A second side of the ring VCO 1680 is connected to a first side of the transmission line 1671 and a first side of the capacitor 1691. A second side of the capacitor 1691 is connected to a gate of the FET 1672 and a first side of the resistor 1692. A second side of the resistor 1692 is connected to a bias voltage $V_{bias1}$. A second side of the resistor 1671 is connected to ground. A source of the FET 1672 is connected to ground. A first side of the inductor 1673 is connected to the voltage $V_{DD}$ and a second side of the inductor 1673 is connected to a drain of the FET 1672 and a voltage tap $V_{HARM-}$.

Regarding the inventions described herein, it is to be appreciated that the same are not limited to a cross-coupled VCOs and, thus, any differential VCO can be utilized for harmonic frequency generation. For multi-stage oscillators and ring oscillators, higher harmonics can be generated.

Figure 17:
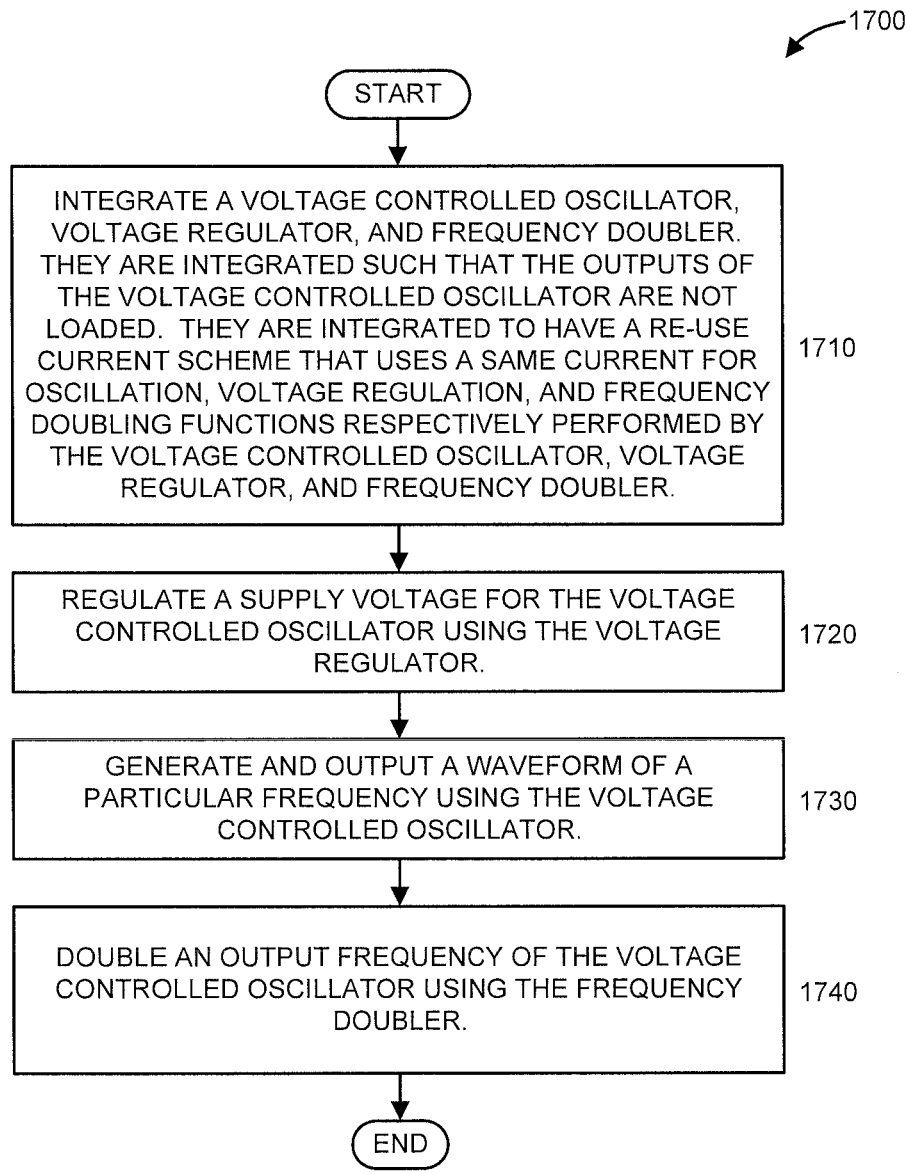
FIG. 17 is a flow diagram showing a method 1700 for providing an electronic device, in accordance with an embodiment of the present principles.

FIG. 17 is a flow diagram showing a method 1700 for providing an electronic circuit, in accordance with an embodiment of the present principles.

At step 1710, integrate a voltage controlled oscillator, voltage regulator, and frequency doubler. The voltage controlled oscillator, voltage regulator, and frequency doubler are integrated such that the outputs of the voltage controlled oscillator are not loaded. Moreover, the voltage controlled oscillator, the voltage regulator, and the frequency doubler are integrated to have a re-use current scheme that uses a same current for oscillation, voltage regulation, and frequency doubling functions respectively performed by the voltage controlled oscillator, frequency doubler, and voltage regulator.

At step 1720, regulate a supply voltage for the voltage controlled oscillator using the voltage regulator.

At step 1730, generate and output a waveform of a particular frequency using the voltage controlled oscillator.

At step 1740, double an output frequency of the voltage controlled oscillator using the frequency doubler.

Figure 18:
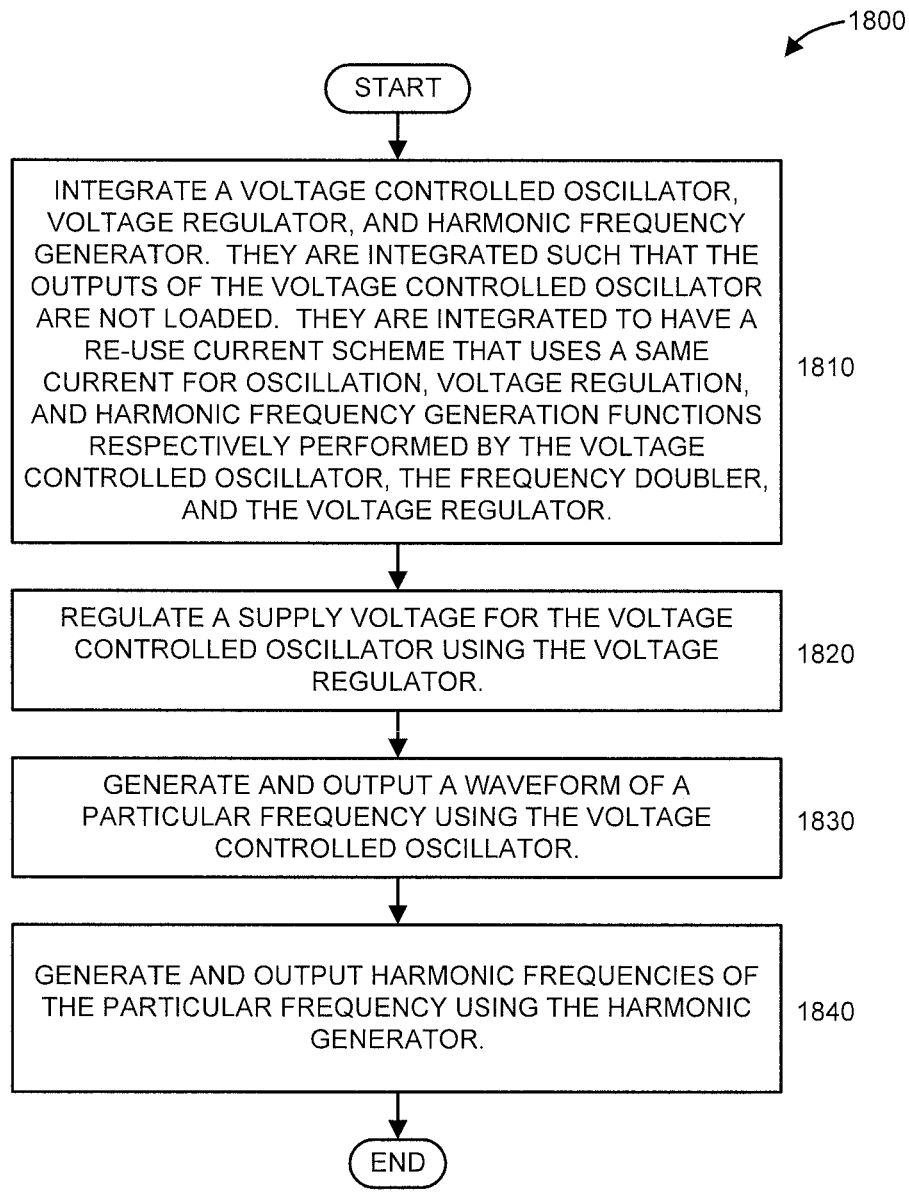
FIG. 18 is a flow diagram showing another method 1800 for providing an electronic device, in accordance with an embodiment of the present principles.

FIG. 18 is a flow diagram showing another method 1800 for providing an electronic circuit, in accordance with an embodiment of the present principles.

At step 1810, integrate a voltage controlled oscillator, voltage regulator, and harmonic frequency generator. The voltage controlled oscillator, voltage regulator, and harmonic frequency generator are integrated such that the outputs of the voltage controlled oscillator are not loaded. Moreover, the voltage controlled oscillator, voltage regulator, and harmonic generator are integrated to have a re-use current scheme that uses a same current for oscillation, voltage regulation, and harmonic frequency generation functions respectively performed by the voltage controlled oscillator, voltage regulator, and harmonic frequency generator.

At step 1820, regulate a supply voltage for the voltage controlled oscillator using the voltage regulator.

At step 1830, generate and output a waveform of a particular frequency using the voltage controlled oscillator.

At step 1840, generate and output harmonic frequencies of the particular frequency using the harmonic generator.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method, comprising:
forming a voltage controlled oscillator and a frequency doubler as an integrated electronic circuit having a frequency doubling output of the frequency doubler that is load isolated from an output of the voltage controlled oscillator using an active device;
generating a waveform of a particular frequency using the voltage controlled oscillator;
doubling and outputting the waveform with a frequency double the particular frequency using the frequency doubler.

2. The method of claim 1, wherein the voltage controlled oscillator and the frequency doubler are integrated to have a re-use current scheme that uses a same current for oscillation and frequency doubling functions respectively performed by the voltage controlled oscillator and the voltage regulator.

3. The method of claim 1, wherein said forming step comprises forming the voltage controlled oscillator, the frequency doubler, and a voltage regulator as the integrated electronic circuit, and the method further comprises regulating a supply voltage for the voltage controlled oscillator using the voltage regulator.

4. The method of claim 3, wherein the voltage controlled oscillator, the voltage regulator, and the frequency doubler are integrated to have a re-use current scheme that uses a same current for oscillation, voltage regulation, and frequency doubling functions respectively performed by the voltage controlled oscillator, the frequency doubler, and the voltage regulator.

5. A method, comprising:
forming a voltage controlled oscillator and a harmonic frequency generator as an integrated electronic circuit having a harmonic frequency output of the harmonic frequency generator that is load isolated from an output of the voltage controlled oscillator using an active device;
generating a waveform of a particular frequency using the voltage controlled oscillator;
generating and outputting the waveform with harmonic frequencies of the particular frequency using the harmonic frequency generator.

6. The method of claim 5, wherein the voltage controlled oscillator and the harmonic generator are integrated to have a re-use current scheme that uses a same current for oscillation and harmonic frequency generation functions respectively performed by the voltage controlled oscillator and the harmonic frequency generator.

7. The method of claim 5, wherein said forming step comprises forming the voltage controlled oscillator, harmonic frequency generator, and a voltage regulator as the integrated electronic circuit, and the method further comprises regulating a supply voltage for the voltage controlled oscillator using the voltage regulator.

8. The method of claim 7, wherein the voltage controlled oscillator, the voltage regulator, and the harmonic generator are integrated to have a re-use current scheme that uses a same current for oscillation, voltage regulation, and harmonic frequency generation functions respectively performed by the voltage controlled oscillator, the voltage regulator, and the harmonic frequency generator.

9. The method of claim 1, wherein the frequency doubler is formed to comprise a common gate amplifier as the active device, the common gate amplifier for increasing a frequency doubler output power.

10. The method of claim 9, wherein the voltage controlled oscillator is formed to include an inductor having a center tap connected to a frequency doubling input of the frequency doubler.

11. The method of claim 3, wherein the frequency doubler is formed to include the active device for load isolating the frequency doubling output of the frequency doubler from the output of the voltage controlled oscillator, the active device further for isolating a voltage regulator output from the frequency doubling output of the frequency doubler and from the output of the voltage controlled oscillator.

12. The method of claim 7, wherein the harmonic frequency generator is formed to include the active device for load isolating the harmonic frequency output of the harmonic frequency generator from the output of the voltage controlled oscillator, the active device further for isolating a voltage regulator output from the harmonic frequency output of the harmonic frequency generator and from the output of the voltage controlled oscillator.

* * * * *